June 21, 1966 J. B. HANGSTEFER 3,256,587

METHOD OF MAKING VERTICALLY AND HORIZONTALLY INTEGRATED MICROCIRCUITRY

Filed March 23, 1962

INVENTOR.

JAMES B. HANGSTEFER

BY

Dike, Thompson, Bronstein & Mrose

ATTORNEYS

United States Patent Office 3,256,587

Patented June 21, 1966

3,256,587

METHOD OF MAKING VERTICALLY AND HORIZONTALLY INTEGRATED MICROCIRCUITRY

James B. Hangstefer, Beverly, Mass., assignor to Solid State Products, Inc., Salem, Mass., a corporation of Massachusetts Filed Mar. 23, 1962, Ser. No. 181,951
7 Claims. (Cl. 29—155.5)

The present invention relates to improvement of miniature electrical semiconductor apparatus and, in one particular aspect, to novel and improved electrical circuitry including a minute semiconductor body which forms both one or more semiconductor circuit components and a substrate with which circuit interconnections, and other circuit elements as needed, are integrated into a rugged and highly miniaturized module.

A major emphasis in modern electronic circuit developments is in the direction of reducing size, weight and susceptibility to failure under very severe environmental conditions of use. Because of the high degree of miniaturizations already attained in pursuing these objectives, many such equipments, commonly referred to as "microsystems" or "microcircuits," have virtually eliminated waste space regions and have become essentially monolithic in character. This is particularly true in the case of certain circuitry incorporating semiconductor devices, wherein distributed-parameter networks may be synthesized in three-dimensional blocks of semiconductor material. Cascading of layers and the addition of various forms of semiconductor appendages permit the duplication of a number of electronic circuit functions, such as those of amplifiers, oscillators, detectors, mixers, multivibrators, gates, and the like all within miniature monolithic structures. However, these techniques can be exploited only in limited types and sizes of circuits, such that desired versatility in design and use is lacking. It is for the latter reason that resort must then be had to conventional auxiliary wiring techniques, or to the use of auxiliary printed circuit boards, for the purpose of interconnecting separate components in needed circuit relationships. While these components may be integrated into rigid sub-assemblies by encapsulation, the resulting structure nevertheless tends to be relatively bulky for many purposes, and the difficulties of assembling and connecting the components increase as the size is sought to be reduced. In accordance with the present teachings, however, microcircuitry may be fabricated in a varity of forms which afford a high degree of needed flexibility in design of circuits with various components and component parameters, and in which the components are nevertheless advantageously integrated into minuscule units which are of substantially monolithic character.

It is one of the objects of the present invention, therefore, to provide improvements in microcircuitry whereby semiconductor and other electric circuit components may readily be integrated into unitary monolithic structures of minute proportions.

A further object is to provide novel and improved microcircuit structures of a double-substrate type wherein semiconductor components are developed within a thin silicon substrate coated with an integral vitreous insulating substrate upon which are deposited integral circuit interconnections and components.

By way of a summary account of practice of this invention in one of its aspects, P-N junction devices are formed in different regions within a thin high-resistivity wafer or stratum of silicon, as by conventional gaseous diffusion techniques, with intended areas for electrical contacting exposed on one planar surface. A vitreous layer is developed across at least the same planar surface of the stratum, in one or more steps, and the intended small areas for electrical contacts with the junction devices are exposed by selective removal of the vitreous layer, preferably by way of masked etching. Thereafter, a thin layer of low-conductivity metal, such as tantalum, is deposited over the surface of the vitreous insulating layer, and a further layer of high-conductivity metal, such as gold, is deposited atop the first. Selective etch removal of portions of the high-conductivity layer, and further selective removal of portions of the low-conductivity material, leaving conductive paths of predetermined lengths and orientation atop the vitreous insulating layer, provide resistances and circuit interconnections with the junction devices, as needed. Contact or terminal areas are among these sites at which the high-conductivity layer is retained, and wired contacts with these areas are brought out from an enclosure for the microcircuit through suitable terminal leads. Substrate areas of but one-tenth square inch or less may be involved, although numerous semiconductive, resistive, and capacitive elements are integrated into one solid structure.

Although the features of this invention which are considered to be novel are set forth in the appended claims, further details as to preferred practices of the invention, as well as the further objects and advantages thereof, may be most readily comprehended through reference to the following description taken in connection with the accompanying drawings, wherein:

FIGURE 1 provides a schematic diagram of a typical electronic circuit array which may be fabricated in integrated microcircuit form in practice of the present teachings;

Figure 1:
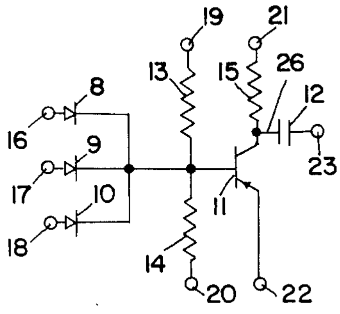
Figure 2:
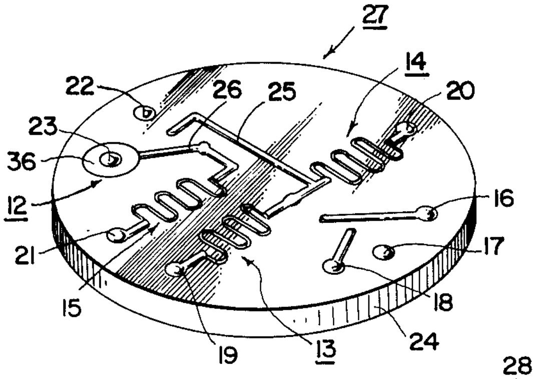
FIGURE 2 is a pictorial view of a microcircuit subassembly of the circuit of FIGURE 1.

The schematic circuit illustrated in FIGURE 1 is of a typical form, for purposes of this disclosure, and is shown to include as components three diodes, 8–10, a transistor 11, a capacitor 12, and three resistances of prescribed values, 13–15. These circuit components are in connections with eight terminals, 16–23, and are further intercoupled by way of the additional leads shown in the illustration. This same assembly of numerous components, interconnections, and terminals, is duplicated in a microcircuit form in the sub-assembly enlargement portrayed in FIGURE 2, the area of the thin circular and substantially planar substrate 24 there being of the order of but one-tenth square inch, or less. Other than for the minute protrusions of the terminal or contact areas 16–23, and the barely perceptible protrusions of interconnections such as those identified by reference characters 25 and 26, and to an even lesser extent the protrusions of film-like resistance and capacitance elements, the sub-assembly 27 is essentially planar and two-dimensional. Moreover, because of its unique construction, the sub-assembly is monolithic, i.e., its elements are solidly integrated into a unitary rugged structure possessing no voids whatsoever and there is no freedom for relative movements between any of its parts. This construction is one which readily leads itself to mounting, connection with other circuitry, association with heat-dissipation elements, and hermetic enclosure, all in accordance with techniques which have been well developed in connection with common forms of semiconductor devices.

Figure 3A:
FIGURE 3A represents a cross-section of a thin high-resistivity semiconductor wafer or substrate with which a microcircuit is to be developed.
Figure 4A:
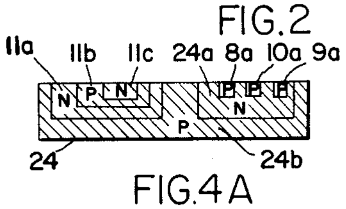
FIGURE 4A represents a cross-section of a semiconductor substrate processed to include a plurality of diffused P-N regions which form four P-N junction semiconductor elements, the regions being designated by superimposed linework.
Figure 3B:
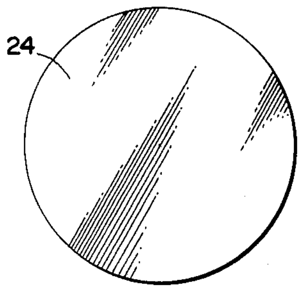
FIGURE 3B is a plan view of the substrate of FIGURE 3A.
Figure 4B:
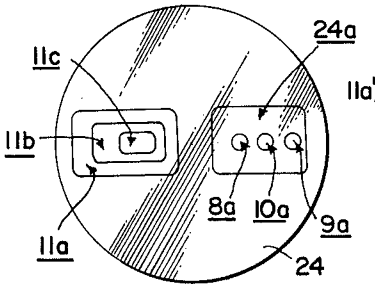
FIGURE 4B is a plan view of the plural-junction substrate of FIGURE 4A.

Preferred practices by which the completed micro-circuit sub-assembly (FIGURE 2), is fabricated are best understood in relation to the sequence of drawings next considered. FIGURES 3A and 3B depict the flat circular wafer or die 24 of a high-resistivity silicon at an initial stage in the manufacturing process, and it is noted that in FIGURE 3A (as well as 4A, 5A and 6A) the thickness of the wafer is highly exaggerated in relation to the corresponding surface area (FIGURE 3B) as an aid to illustration. In practice, the wafer is preferably made very thin when considered in relation to the diminutive surface area, the latter being only about one-tenth square inch. Subsequently, diffused regions of the different conduction characteristics needed to develop the desired junction semiconductor devices are created in the silicon wafer. Techniques for impregnation or diffusion of "donor" and "acceptor" impurity elements are of course well known for the purpose of producing N-type and P-type regions, respectively, in the semiconductor material, and the conduction regions designated in FIGURE 4A are developed in accordance with such techniques, preferably by gaseous diffusion techniques involving application of impurity elements carried in gaseous atmospheres. As the results of these diffusions, the junctions needed to create an asymmetrically conductive device in the form of the transistor 11 in FIGURE 1 are produced by the N-type region **11*a*, P-type region 11*b*, and N-type region 11*c*, while the junctions needed to create the three diode devices 8–10 are produced between the further N-type region 24*a* and each of the three further P-type regions 8*a*, 9*a*, and 10*a*. Remaining semiconductor material 24*b* between the N-type regions 11*a* and 24*a*** is maintained wtih P-type conduction characteristics, to assure that a desired electrical circuit isolation will occur between these two regions. Each of the prescribed conduction regions is produced near the top surface of the silicon wafer, with a substantial predetermined area adjoining that surface and exposed for the subsequent bonding of certain electrical contacts therewith, as marked by the linework about the designated regions in FIGURE 4B. The intended areas for contact with these regions are temporarily coated by a layer of vitreous insulating layer, such as an oxidized layer of the semiconductor material, and are thereby temporarily insulated. Such insulation may be developed solely by the oxidation of the silicon substrate, which forms a thin integral silicon dioxide coating as the substrate is exposed to an oxidizing atmosphere at high temperatures. Such a coating may be produced in a separate heating and oxidizing step, or, in some practices it suffices to build up the silicon dioxide coating by way of the separate successive layers of silicon dioxide which appear on the substrate as the junction devices are being formed. The aforementioned insulating silicon dioxide may alone serve as the desired vitreous insulating layer in certain practices of this invention, or, alternatively or in conjunction therewith, a separately-deposited vitreous layer may be used. By way of example, fineyl-powdered glass may be deposited from a suspension, or electrostatically, and then fired to form the integral insulating layer.

Figure 5A:
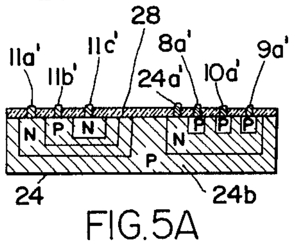
FIGURE 5A represents a cross-section of a plural-junction substrate which has been integrated with a further vitreous insulating substrate and having exposed junction contacts.
Figure 5B:
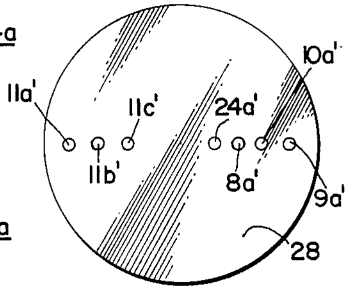
FIGURE 5B is a plan view of the double-substrate unit of FIGURE 5A.
Figures 6A, 6B:
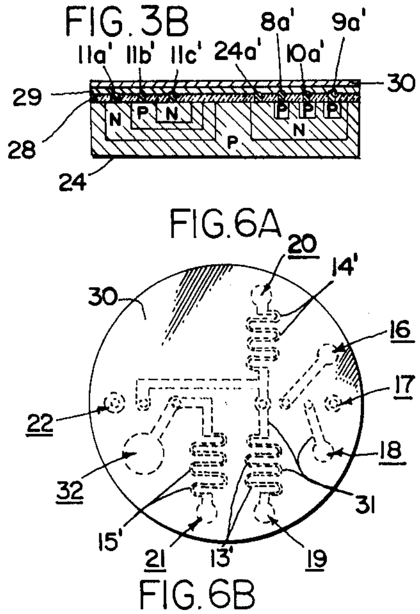
FIGURE 6A represents a cross-section of a double-substrate plural-junction unit wherein the junction contacts and insulating substrate are further coated with layers of both low-conductivity and high-conductivity materials.
FIGURE 6B is a plan view of the unit of FIGURE 6A intended masking areas for selective removal and retention of the outer coating materials being indicated by superimposed dashed linework.

Although the aforementioned vitreous insulating coating may cover the entire silicon substrate when it is formed, such portions as are unwanted in the finished product may be removed, as by chemical etching. As is shown in FIGURES 5A and 5B, seven small discrete connection points with the seven underlying regions of the silicon substrate are formed through the vitreous insulating coating 28 and are thus exposed for circuit interconnection purposes. For convenience in description, these are designated by the same reference characters as the corresponding regions with which they are in contact, with distinguishing single-prime accents added. The insulating coating is exaggerated in height as an aid to illustration At this stage of the fabrication of the microcircuitry, there are essentially two substrates in existence: a primary substrate 24 in the form of the semiconductor wafer which provides mechanical strength, and an auxiliary substrate 28 in the form of the integrally-formed vitreous layer which affords needed electrical insulation. The latter serves as a base upon which circuit interconnections and certain components are developed, integrally. As a preparatory step, the insulating coating 28 which the electrode connections projecting through it is first coated with a deposited film of layer 29 (FIGURE 6A) of a so-called "high ohms/square" metal, preferably tantalum, or alternatively a nickel-chromium-iron alloy or the like, which possesses low electrical conductivity and may therefore aid in the later formation of prescribed highly-resistive circuit components. In turn, a further metal film or layer 30 is deposited upon the tantalum film 29, this second film having a high electrical conductivity characteristic which may aid in the later formation of prescribed "ohmic" or low-resistance interconnections. Gold is preferred for film 30, although other low-resistance metals having compatibility with certain metal-removing techniques described hereinafter may also be used, silver being a further example. The needed resistive components and circuit interconnections are created through selective removal of predetermined portions of the applied films. Double-dashed linework 31 in FIGURE 6B indicates those portions of the films, enclosed within this linework, which are to remain for these purposes. Except for the generally circular area 32 and the narrower sinuous paths 14', 13' and 15' in FIGURE 6B, the gold film 39 is permitted to remain in place atop the tantalum film in the paths enclosed by the dashed linework 31, while being entirely removed elsewhere by selective etching. In the latter connection, selective removal may be accomplished through practice of known techniques useing a photo resist material as a masking medium and chemical etching for removal of the metal films in those regions where they are not desired. High-temperature sintering of the device may be accomplished either before or after the selective removal steps, for the purpose of establishing a stronger bond between the vitreous insulating layer and the tantalum and between the tantalum and gold film.

Elongated paths of resistances 13, 14 and 15 (FIGURE 1), which remain after the etching procedures are completed, will exhibit predetermined values of resistance depending upon the lengths and cross-sections of the paths as well as the characteristic resistance per unit volume of the high-resistivity material itself. The latter characteristic is a fixed one for the deposited metal film material, such as deposited tantalum, and the thickness of the deposited film is readily controlled within significant limits, and the ultimate regulation of actual resistance is therefore left to the length and width proportions of the paths as determined by the masking and etching. In the case of tantalum, resistivity is about 15.5 ohm-cm., although resistivities higher and somewhat lower than this are satisfactory for present purposes also. Although the paths forming the three resistances in the illustrated microcircuit are shown to be sinuous, it should be understood that they be of other useful configurations also. Interconnection paths of low resistance are formed along the shortest and most direct practical routes, by the unetched portions of the low-resistance gold film which is electrically parallelled with the underlying tantalum film extending over these same routes. Separate connections between the resistance elements and interconnecting low-resistance material are thus unnecessary. The gold film is also masked and retained in place at each of the intended sites of a terminal for external connection, such as the sites **16*a*–22*a*** designated in FIGURE 6B, these sites being enlarged to facilitate electrical connection with lead wires.

Figure 7:
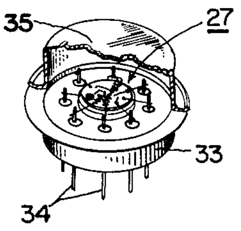
FIGURE 7 depicts an assempled and hermetically enclosed microcircuit assembly, with a portion of the enclosure broken away to reveal internal constructional detail.

As is portrayed in FIGURE 7, a monolithic microcircuit sub-assembly of the aforesaid construction well lends itself to mounting and hermetic enclosure after the fashion of simple semiconductor devices. The double-substrate assembly 27 is there shown positioned centrally upon a metal base 33, with each of the terminal sites bonded to a lead wire in accordance with known techniques, the lead wires in turn each being connected to a different one of the insulated terminal pins 34 projecting through the base. A metal header or cap 35 completes the enclosure, with the illustrated juxtaposed flanges of the base and header being sealed together in a known manner.

While the circuit of FIGURE 1 includes a capacitance 12, it is of course commonly the case that these forms of circuit elements are not used and that the teachings of the present invention are applicable where only plural semiconductor devices are involved in microcircuit interconnections, or where such devices and one or more resistance elements are involved. However, the formation of capacitance elements is also readily and advantageously achieved in the same monolithic assembly, in a manner next explained. At the relatively large-area site 32 (FIGURE 6B) where a capacitor is to be developed, the gold or equivalent film 30 is removed by the aforementioned etching at the same time that it is being removed from other areas where it is not of use, and the tantalum or equivalent film 29 is masked with emulsion to remain extant across the area 32 when unwanted portions of the tantalum are etched away. When the protective emulsion is removed from this relatively large-area tantalum surface, that surface is then selectively oxidized or anodized (to the exclusion of other tantalum surfaces) in accordance with a known method, such as a known electrochemical method. The resulting oxidized tantalum surface layer or film has outstanding dielectric properties, as do the oxides of certain other metals which may be used in lieu of the tantalum, and a capacitor is then completed simply by depositing a metallic electrode layer 36 (FIGURE 2) atop the oxide coating. The latter step is conveniently performed by common vacuum deposition, sputtering, or silk-screening methods, for example. More than one capacitor may obviously be produced on a single sub-assembly, if required.

In the completed sub-assembly, the vitreous insulating substrate is integral with both the underlying silicon substrate and with the overlying connection and circuit component layers. Its properties provide the desired electrical isolations, while at the same time the overall bulk of the microcircuit is kept to a minimum and the thermal dissipation capabilities remain high. The wholly integrated monolith also inherently possesses a high degree of immunity to effects of shock and vibration.

Those skilled in the art will appreciate that the illustrated configurations and packaging and the specific processing steps discussed are susceptible to change as dictated by need. By way of examples, it should be understood that more than one side of a single silicon substrate may be exploited, both for the formation of P–N regions and for the development of overlying insulated connections and component, and that such microcircuits may be stacked together, and encapsulated. Accordingly, it should be understood that the specific practices and constructions here illustrated and described are presented for purposes of disclosure rather than as limitations, and that in the appended claims it is aimed to cover all such modifications and equivalencies as fall within the true spirit and scope of this invention.

What I claim as new and desire to secure by Letters Patent of the United States is:

1. The method of fabricating integrated microcircuitry which comprises exposing a high-resistance mass of silicon to impurity elements and to an oxidizing atmosphere and forming at least one asymmetrically-conductive device therein having different conduction regions exposed to a vitreous insulating stratum on the mass with discrete openings through the insulating stratum each communicating with a different one of the regions, applying high-resistivity metal atop the insulating stratum and forming an electrically-conductive high-resistance continuous coating therewith integrally with the insulating stratum and in electrical connection with the different-conduction regions by way of the openings, applying high-conductivity metal atop the high-resistivity metal, selectively removing portions of the high-conductivity metal while leaving other portions intact along predetermined areas atop the high-resistivity metal to form low-resistance circuit connections, and selectively removing portions of the high-resistivity metal while leaving other portions of the high-resistivity metal intact along predetermined paths including at least one elongated tortuous path forming an electrical resistance component, said paths being electrically independent of each other and in electrical circuit connection with the different circuit-conduction regions, whereby series and parallel connections may be selectively effected therebetween.

2. The method of fabricating integrated microcircuitry which comprises introducing impurity elements into a mass of silicon to form at least one asymmetrically-conductive element having different conduction regions exposed to the surface of the mass, developing a vitreous insulating coating upon the surface of the mass, removing at least part of the vitreous insulating coating atop each of the exposed different-conduction regions, depositing electrically-conductive contacts directly onto the exposed different-conduction regions, coating the insulating coating and contacts integrally with a first layer of high-resistivity metal, coating the first layer integrally with a second layer of low-resistivity metal, selectively removing portions of the second layer while leaving other portions intact along paths wherein high electrical conductivity connections are required, and selectively removing portions of the first layer while leaving the remaining portions of the second layer intact and while leaving other portions of the first layer intact along paths wherein electrical resistance is required said paths being electrically independent of each other and in electrical circuit connection with the different circuit-conduction regions, whereby series and parallel connections may be effected therebetween.

3. The method of fabricating integrated microcircuitry which comprises introducing impurity elements into a mass of silicon to form at least one asymmetrically-conductive element having different conduction regions exposed to the surface of the mass, developing a vitreous insulating coating upon the surface of the mass, removing at least part of the insulating coating atop each of the exposed different-conduction regions, depositing electrically-conductive contacts directly onto the exposed different-conduction regions, coating the vitreous insulating coating and contacts with a layer of tantalum, coating the layer of tantalum with a layer of gold, selectively removing portions of the layer of gold while leaving other portions intact along paths wherein high electrical conductivity connections are required, and selectively removing portions of the layer of tantalum without removing the remaining portions of the gold layer while leaving other portions of the tantalum along paths wherein electrical resistance is required said paths being electrically independent of each other and in electrical circuit connection with the different circuit-conduction regions, whereby series and parallel connections may be effected therebetween.

4. The method of fabricating integrated microcircuitry which comprises exposing a high-resistance mass of silicon to impurity elements and to an oxidizing atmosphere and forming a plurality of asymmetrically-conductive junction devices therein each having their different conduction regions exposed to a vitreous insulating stratum on the mass with discrete openings through the insulating stratum each communicating with a different one of the regions, applying high-resistivity metal atop the insulating stratum and forming an electrically-conductive high-resistance continuous coating therewith integrally with the insulating stratum and in electrical connection with the different-conduction regions by way of the openings, applying high-conductivity metal in a continuous layer atop the conductive coating integrally therewith, selectively removing portions of the high-conductivity metal layer while leaving intact the high-resistance metal coating as well as other portions of the high-conductivity layer which lie along predetermined paths forming low-resistance electrical circuit connections and circuit terminals, and selectively removing portions of the high-resistivity material while leaving intact the high-conductivity metal as well as other portions which lie along predetermined paths including at least one elongated tortuous path forming an electrical resistance component said paths being electrically independent of each other and in electrical circuit connection with the different circuit-conduction regions, whereby series and parallel connections may be effected therebetween.

5. The method of fabricating integrated microcircuitry which comprises exposing a high-resistance mass of silicon to impurity elements and to an oxidizing atmosphere and forming at least one asymmetrically-conductive device therein having different conduction regions exposed to a vitreous insulating stratum on the mass with discrete openings through the insulating stratum each communicating with a different one of the regions, applying tantalum atop the insulating stratum and forming an electrically-conductive high-resistance continuous tantalum coating therewith integrally with the insulating stratum and in electrical connection with the different-conduction regions by way of the openings, applying high-conductivity metal atop the tantalum coating integrally therewith, selectively removing portions of the high-conductivity metal while leaving intact the tantalum coating as well as other portions of the high-conductivity metal which lie along predetermined paths forming low-resistance electrical circuit connections and circuit terminals, selectively removing portions of the tantalum coating while leaving other portions intact along predetermined surface areas including at least one elongated tortuous path forming an electrical resistance component and including at least one enlarged area which is to form one electrode of a capacitance, forming an oxide dielectric film atop the enlarged area, and depositing a metal electrode atop the oxide dielectric film to form a capacitance element between the electrodes.

6. The method of fabricating integrated microcircuitry which comprises exposing a thin flat high-resistance wafer of silicon to impurity elements and to an oxidizing atmosphere and forming at least one asymmetrically-conductive device therein which is of relatively small area in relation to the area of the wafer and has different conduction regions exposed to a vitreous insulating stratum on at least one side of the wafer with discrete openings through the insulating stratum each communicating with a different one of the regions, separately applying a plurality of layers of metal atop the insulating stratum integrally with the insulating stratum and with each other and in electrical connection with the different-conduction regions by way of the openings, the said layers including a layer of high-resistivity metal and a layer of low-resistivity metal, selectively removing portions of one of the metal layers which overlies at least one other layer while leaving other portions of the same layer intact along predetermined surface areas, and then selectively removing portions of another of the metal layers while leaving portions intact along predetermined paths including the said predetermined surface areas and which are electrically independent of each other and in electrical circuit connections with the different-conduction regions and which extend beyond the relatively small areas of the asymmetrically-conductive device in the wafer, whereby series and parallel connections may be selectively effected therewith.

7. The method of fabricating integrated microcircuitry which comprises diffusing impurity elements into a thin silicon wafer to form a plurality of asymmetrically-conductive elements having P–N junctions between regions of different conduction characteristics exposed to one side of the wafer, developing a vitreous insulating layer on at least the one side of the wafer, having discrete openings therethrough each communicating with a different one of the different-conduction regions, depositing electrically-conductive metal in each of the openings and thereby forming contacts integral with the different-conduction regions, depositing a thin and uniform-thickness continuous coating of tantalum atop the vitreous insulating layer and contacts integrally therewith, depositing a continuous layer of low-resistivity metal atop the tantalum coating and integrally therewith, selectively etching away portions of the metal layer while masking and leaving other portions intact along paths of intended low-resistance connections and contact terminals and while leaving the tantalum coating intact, selectively etching away portions of the tantalum coating while masking and leaving other portions intact along predetermined areas including paths of intended high-resistance connections and while leaving intact the remaining portions of the low-resistance metal, whereby series and parallel connection may be selectively effected between said paths.

References Cited by the Examiner

UNITED STATES PATENTS

| | | | |
|---|---|---|---|
| 2,903,627 | 9/1959 | McGarvey | 317—101 |
| 2,978,612 | 4/1961 | Lutton | 317—101 |
| 2,981,877 | 4/1961 | Noyce | 29—155.5 |
| 2,986,804 | 6/1961 | Greenman et al. | 29—155.5 |
| 3,059,320 | 10/1962 | Seabury et al. | 29—155.5 |
| 3,158,788 | 11/1964 | Last | 317—235 |

OTHER REFERENCES

Integrated Circuit Package, R. S. Schwartz, I.B.M. Technical Disclosure Bulletin, vol. 3, No. 12, May 1961.

Aviation Week (Klass) Sept. 28, 1959, pp. 73, 75, 77, 79, 80, 83, 84 and 87.

WHITMORE A. WILTZ, *Primary Examiner.*

ELI J. SAX, *Examiner.*

J. G. COBB, P. M. COHEN, *Assistant Examiners.*